(12) United States Patent
Kondo et al.

(10) Patent No.: US 6,812,041 B2
(45) Date of Patent: Nov. 2, 2004

(54) METHOD OF MANUFACTURING FERROELECTRIC CAPACITOR USING A SINTERING ASSISTANCE FILM

(75) Inventors: Kazuaki Kondo, Kawasaki (JP); Hideyuki Noshiro, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/457,538

(22) Filed: Jun. 10, 2003

(65) Prior Publication Data

US 2003/0232479 A1 Dec. 18, 2003

(30) Foreign Application Priority Data

Jun. 13, 2002 (JP) ........................................ 2002-173135

(51) Int. Cl.⁷ ...................... H01L 21/00; H01L 21/8242
(52) U.S. Cl. .......................................... 438/3; 438/240
(58) Field of Search ..................................... 438/3, 240

(56) References Cited

U.S. PATENT DOCUMENTS

| | | | | |
|---|---|---|---|---|
| 5,572,052 A | * | 11/1996 | Kashihara et al. | 257/295 |
| 5,820,946 A | * | 10/1998 | Kim et al. | 427/561 |
| 5,840,615 A | * | 11/1998 | Aoki et al. | 438/396 |
| 5,913,117 A | * | 6/1999 | Lee | 438/240 |
| 6,514,895 B1 | * | 2/2003 | Chiu et al. | 501/137 |
| 6,543,107 B1 | * | 4/2003 | Miyashita et al. | 29/25.35 |

* cited by examiner

Primary Examiner—Howard Weiss
(74) Attorney, Agent, or Firm—Westerman, Hattori, Daniels & Adrian, LLP (57) ABSTRACT

Provided is a method of manufacturing a ferroelectric capacitor capable of manufacturing a ferroelectric capacitor with lower unevenness on a ferroelectric film surface, and thereby with excellent electric characteristics. By sputtering method, a PZT film is formed on a first conductive film, which constitutes a lower electrode of the ferroelectric capacitor. Thereafter, the PZT film is subjected to crystallization treatment (annealing). Next, a silicate solution is coated on the PZT film as a sintering assistance and then dried. Subsequently, sintering treatment is performed at the temperature of about 700° C. In this way, crystals constituting the PZT film are sintered, unevenness on the surface of PZT film is reduced, and tiny pores in grain boundaries are also reduced.

10 Claims, 11 Drawing Sheets

METHOD OF MANUFACTURING FERROELECTRIC CAPACITOR USING A SINTERING ASSISTANCE FILM

CROSS-REFERENCE TO RELATED APPLICATIONS

This application is based upon and claims priority of Japanese Patent Application No. 2002-173135, filed on Jun. 13, 2002, the contents being incorporated herein by reference.

BACKGROUND OF THE INVENTION

1. Field of the Invention

The present invention relates to a method of manufacturing a ferroelectric capacitor constituted by sandwiching a ferroelectric film between a pair of electrodes.

2. Description of the Prior Art

A ferroelectric capacitor utilizes spontaneous polarization phenomenon of a ferroelectric film. A ferroelectric random access memory (FeRAM) including this ferroelectric capacitor is a non-volatile memory which can retain data without a power. The FeRAM has advantages of low voltage requirement upon data writing, and capabilities of high-speed operation and high-frequency data rewriting.

The ferroelectric capacitor is constituted by sandwiching a ferroelectric thin film such as PZT (Pb(Zr,Ti)O$_3$) between a pair of electrodes. In the following, description will be made regarding a conventional method of manufacturing a ferroelectric capacitor with reference to FIGS. 1A and 1B.

Figure 1A:
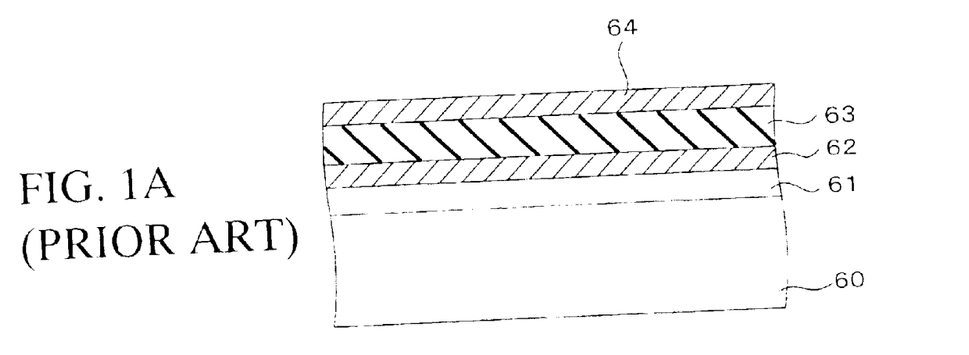
FIGS. 1A and 1B are cross-sectional views showing a conventional method of manufacturing a ferroelectric capacitor.

First, as shown in FIG. 1A, an element such as a transistor (not shown) is formed on a semiconductor substrate 60, and surfaces of the element and the semiconductor substrate 60 are covered with an interlayer insulation film 61. Then, a conductive film 62 which constitutes a lower electrode is formed on the interlayer insulation film 61 by using a conductive material such as platinum (Pt).

Subsequently, a PZT film 63 is formed on the conductive film 62. Sputtering method is generally applied as a method of forming the PZT film 63. However, spin coating method, sol-gel method, metal organic chemical vapor deposition (MOCVD) method or the like may be applied as appropriate.

Thereafter, the PZT film 63 is subjected to crystallization treatment (annealing). In this crystallization treatment, the PZT film 63 is subjected to heating at the temperature of 600° C. for several tens of seconds, for example.

Next, a conductive film 64 which constitutes an upper electrode is formed on the PZT film 63 by using a conductive material such as Pt.

Figure 1B:
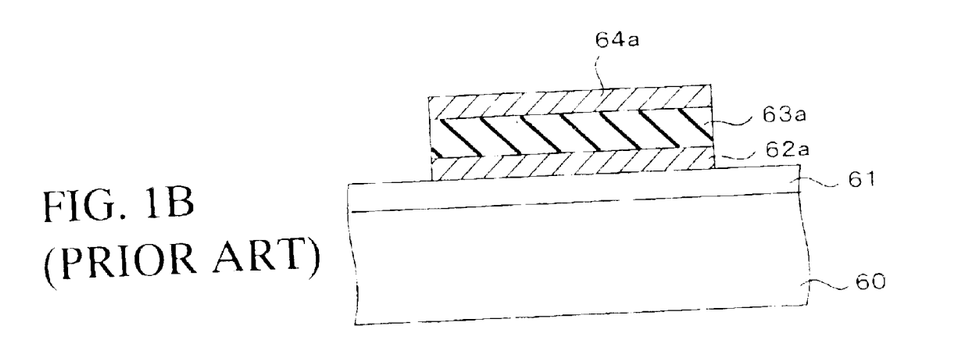

Subsequently, the conductive film 64, the PZT film 63, and the conductive film 62 are patterned into given shapes by photolithography method, whereby an upper electrode 64a, a ferroelectric film 63a, and a lower electrode 62a are formed as shown in FIG. 1B. In this way, a ferroelectric capacitor is completed.

The inventors of the present invention consider that the above-described conventional method of manufacturing a ferroelectric capacitor has following problems.

Figure 2:
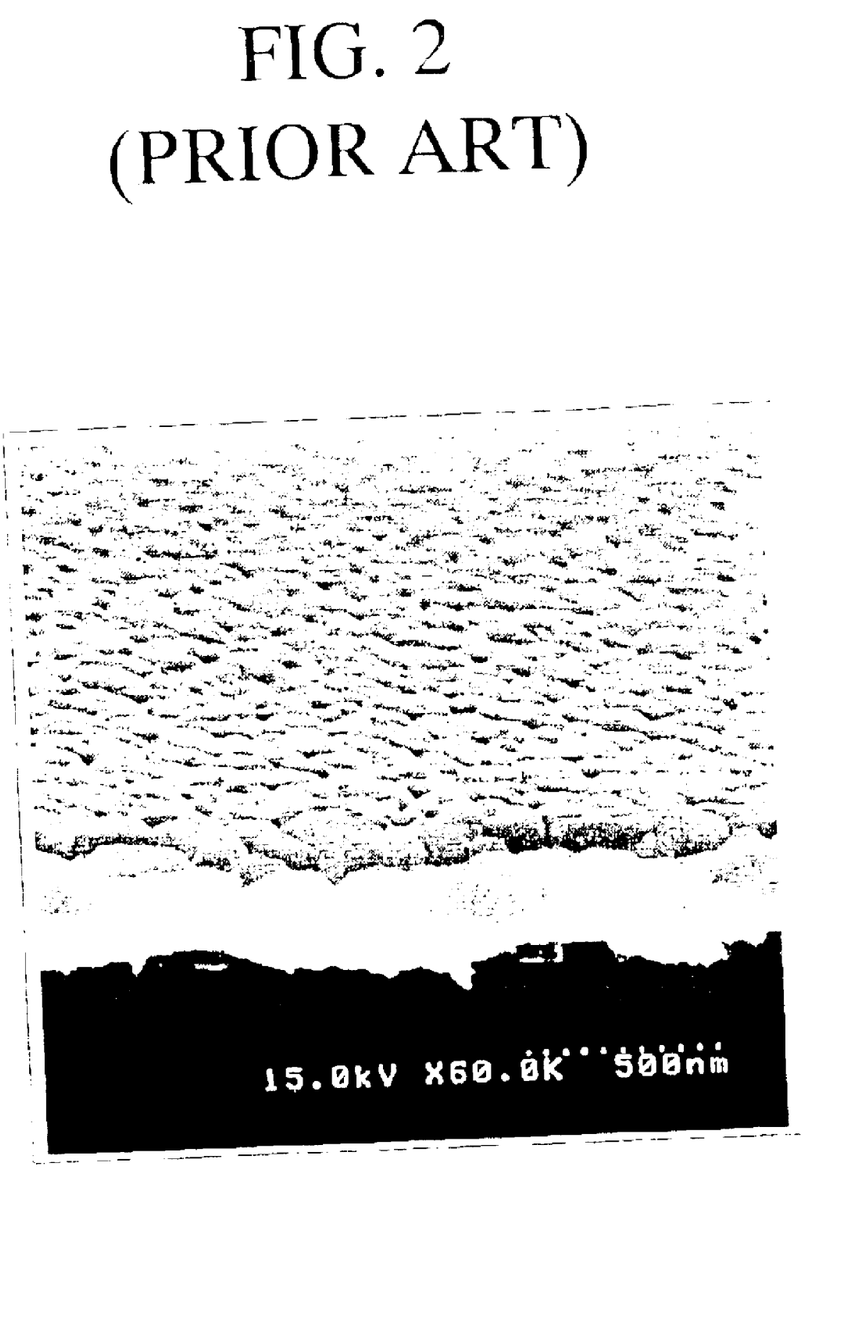
FIG. 2 is a view showing a SEM image of a PZT film surface of a ferroelectric capacitor formed by the conventional method.

FIG. 2 is a scanning electron microscope (SEM) image showing a surface of the PZT film formed by the conventional method. As shown in FIG. 2, the surface of the PZT film formed by the conventional method has relatively high unevenness, and there are tiny pores in grain boundaries. For this reason, problems such as an increase in a leak current occur particularly when the PZT film is thin (about 150 nm or below). In such a case, the ferroelectric capacitor hardly meets required electric characteristics.

SUMMARY OF THE INVENTION

In consideration of the foregoing problems, it is an object of the present invention to provide a method of manufacturing a ferroelectric capacitor which enables to manufacture a ferroelectric capacitor with low unevenness on the ferroelectric film surface and with excellent electric characteristics.

The forgoing problems will be solved by a method of manufacturing a ferroelectric capacitor, which includes the steps of: forming a lower electrode on a semiconductor substrate via an insulation film; forming a ferroelectric film on the lower electrode; subjecting the ferroelectric film to crystallization treatment; forming a sintering assistance film on the ferroelectric film; subjecting the ferroelectric film to sintering treatment; and forming an upper electrode on the ferroelectric film.

Moreover, the foregoing problems will be also solved by a method of manufacturing a ferroelectric capacitor, which includes the steps of: forming a lower electrode on a semiconductor substrate via an insulation film; forming a ferroelectric film on the lower electrode; and forming an upper electrode on the ferroelectric film. Here, the ferroelectric film is formed by repeating a plurality of times the steps of forming a ferroelectric film, forming a sintering assistance film on the ferroelectric film, and performing sintering treatment.

Furthermore, the foregoing problems will be also solved by a method of manufacturing a ferroelectric capacitor, which includes the steps of: forming a lower electrode on a semiconductor substrate via an insulation film; forming a ferroelectric film on the lower electrode; and forming an upper electrode on the ferroelectric film. Here, the ferroelectric film is formed by repeating a plurality of times the steps of forming a ferroelectric film and forming a sintering assistance film on the ferroelectric film, and then by performing sintering treatment.

At the time of formation by sputtering method or the like, the ferroelectric film is amorphous and thereby does not have a ferroelectric characteristic. Therefore, it is necessary to subject the ferroelectric film to heat treatment to crystallize the ferroelectric material. However, only heat treatment cannot achieve sufficient crystallinity. Therefore, relatively high unevenness are developed on the ferroelectric film surface as described above, and the unevenness causes degradation in the electric characteristics.

To improve the crystallinity, it is also conceivable to perform the heat treatment at a higher temperature. However, even the heat treatment at the higher temperature cannot actually reduce the unevenness on the ferroelectric film surface.

The inventors of the present invention have performed various experiments and investigations for eliminating such the unevenness on the ferroelectric film surface. As a result, the inventors have found that the crystallinity is improved so as to even the ferroelectric film surface by firstly coating the sintering assistance on the ferroelectric film surface after the crystallization treatment and by secondly performing the heat treatment. The present invention has been made based on experimental results relevant thereto. Silicate can be used as the sintering assistance, for example.

Moreover, the sintering assistance can be mixed with the ferroelectric material, and the heat treatment can be performed after coating the mixture on the ferroelectric film surface.

When the ferroelectric film is formed by sol-gel method, a plurality of ferroelectric layers is laminated. In this case, it is possible to form the ferroelectric film with excellent electric characteristics by using the sintering assistance in every formation of the ferroelectric layer and then by sintering. Here, it is not always requisite to perform sintering treatment in every formation of the ferroelectric film, but is also possible to perform the sintering treatment just once after alternately laminating the ferroelectric layers and the sintering assistance films.

DETAILED DESCRIPTION OF THE PREFERRED EMBODIMENTS

Now, preferred embodiments of the present invention will be described with reference to the accompanying drawings.
(First Embodiment)

FIG. 3A to FIG. 6 are cross-sectional views showing a method of manufacturing a ferroelectric capacitor in the order of the steps according to a first embodiment of the present invention. Note that the following embodiment shows an example of applying the present invention to manufacture a FeRAM. Moreover, FIG. 3A to FIG. 6 illustrate only a memory cell forming portion. Accordingly, illustrations of a peripheral circuit forming portion are omitted therein.

Figure 3A:
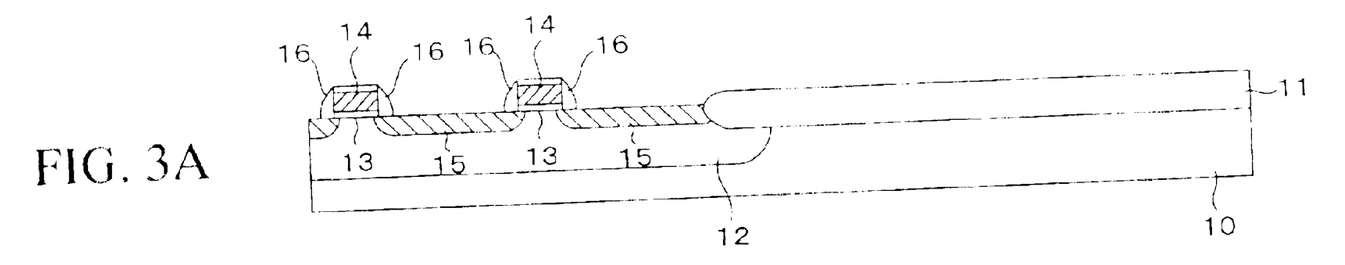
FIGS. 3A and 3B are cross-sectional views showing a method of manufacturing a ferroelectric capacitor according to a first embodiment of the present invention.

First, description will be made regarding the steps for forming a metal oxide silicon (MOS) transistor with reference to FIG. 3A. An element isolation film 11 is selectively formed on a p-type semiconductor (silicon) substrate 10 by local oxidation of silicon (LOCOS) method. Instead of the LOCOS method, shallow trench isolation (STI) method can form the element isolation film.

Thereafter, a p-type impurity is selectively introduced to the n-channel MOS transistor forming region of the semiconductor substrate 10 to form p-wells 12. In this embodiment, the memory cell is composed of the n-channel MOS transistor. Therefore, the p-wells 12 are formed on both of the memory cell forming portion and the peripheral circuit forming portion.

Meanwhile, an n-type impurity is selectively introduced to a p-channel MOS transistor forming region of the peripheral circuit forming potion to form an n-well (not shown). Thereafter, each surface of the semiconductor substrates 10 in these MOS transistor forming regions is subjected to thermal oxidation for forming gate oxide films 13.

Next, a silicon film (an amorphous silicon film or a polysilicon film) and a tungsten silicide film are serially formed over the entire upper surface of the semiconductor substrate 10, then the silicon film and the tungsten silicide film are patterned into given shapes by photolithography method to form gate electrodes 14. In the memory cell forming portion, two lines of gate electrodes 14 are disposed approximately in parallel on one p-well 12. Each gate electrode 14 constitutes a part of word line.

Next, a first step of introducing an n-type impurity takes place to form a source/drain of the n-type MOS transistor. Specifically, the n-type impurity is introduced to the p-well 12 while using the gate electrodes 14 on the p-well 12 as a mask. Similarly, a first step of introducing the p-type impurity takes place to form a source/drain of the p-type MOS transistor. Specifically, the p-type impurity is introduced to the n-well while using the gate electrodes on the n-well as a mask.

Next, a $SiO_2$ film is formed over the entire upper surface of the semiconductor substrate 10 by plasma CVD method. Then, this $SiO_2$ film is etched back so as to leave the $SiO_2$ film on only both sides of the gate electrodes 14, thus forming sidewalls 16. Note that the sidewalls 16 may be formed with a material other than $SiO_2$ (such as SiN) instead.

Thereafter, a second step of introducing the n-type impurity takes place to form another source/drain of a n-type MOS transistor. Specifically, the n-type impurity is introduced to the p-well 12 while using the gate electrodes 14 and the sidewalls 16 on the p-well 12 as a mask. In this way, there is formed an n-type impurity diffusion region 15 which constitutes the source/drain of the n-type MOS transistor. Similarly, a second step of introducing a p-type impurity takes place to form another source/drain of the p-type MOS transistor. Specifically, the p-type impurity is introduced to the n-well while using the gate electrodes and the sidewalls on the n-well as a mask. In this way, there is formed a p-type impurity diffusion region which constitutes the source/drain of the p-type MOS transistor.

Figure 3B:
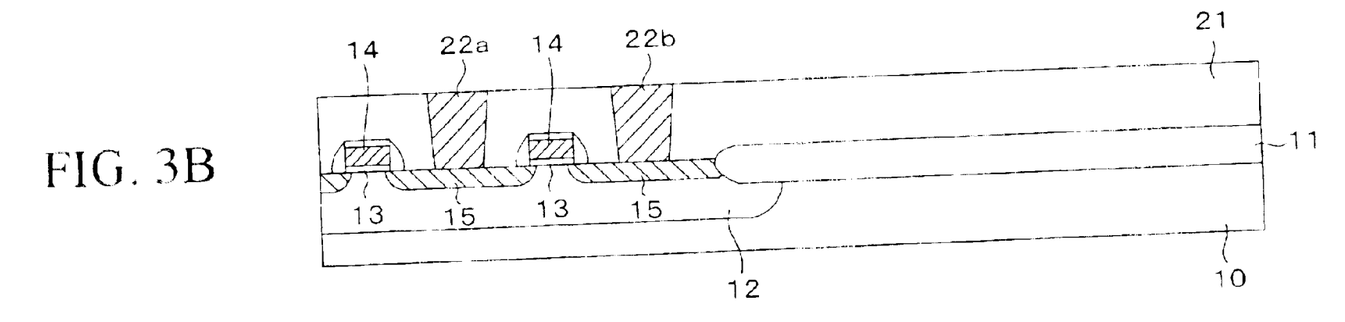

As described above, after forming the n-type MOS transistors and the p-type MOS transistors, an interlayer insulation film 21 is formed over the entire upper surface of the semiconductor substrate 10 by the plasma CVD method as shown in FIG. 3B. This interlayer insulation film 21 is made of SiO$_2$, SiN, SiON or the like, for example. It is also possible to laminate two or more layers of these insulative materials to constitute the interlayer insulation film 21.

Thereafter, the interlayer insulation film 21 is polished by chemical mechanical polishing (CMP) method to even the surface of the interlayer insulation film 21.

Next, contact holes are formed so as to reach from the surface of the interlayer insulation film 21 down to the impurity diffusion region 15, and a conductive material is filled inside these contact holes to form plugs 22a and 22b. Specifically, after forming the contact holes on the interlayer insulation film 21 by the photolithography method, then a titanium (Ti) film in the thickness of about 20 nm is formed over the entire upper surface of the semiconductor substrate 10, and then a titanium nitride (TiN) film in the thickness of about 50 nm is further formed thereon. In this way, bottom faces and side faces of the contact holes are covered with a buffer layer (not shown) which is composed of the Ti film and the TiN film.

Thereafter, a tungsten (W) film is formed over the entire upper surface of the semiconductor substrate 10 by the CVD method. In this event, tungsten is filled inside the contact holes. Next, the tungsten film, the TiN film, and the Ti film are polished by the CMP method until the interlayer insulation film 21 is exposed. In this way, there are formed the plugs 22a and 22b, which are made of tungsten filled in the interlayer insulation film 21.

In one p-well 12 on the memory cell forming potion, the plug 22a located on the n-type impurity diffusion region 15 sandwiched by two gate electrodes 14 is connected to a bit line described later. Meanwhile, the plug 22b located on the n-type impurity diffusion region 15 sandwiched by the gate electrode 14 and the element isolation film 11 is connected to a capacitor described later.

Figure 4A:
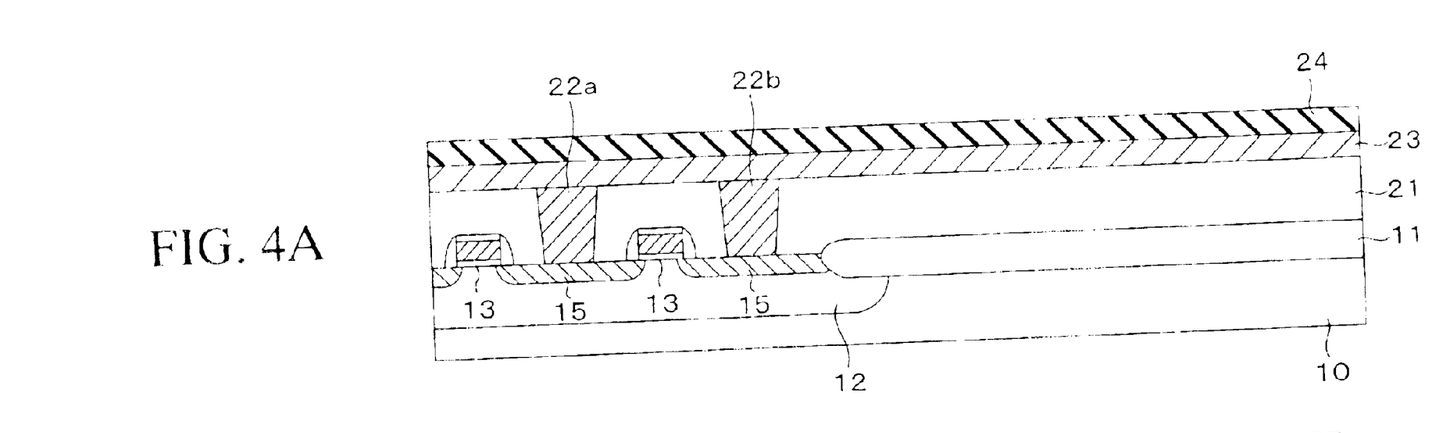
FIGS. 4A and 4B are cross-sectional views showing the method of manufacturing the ferroelectric capacitor according to the first embodiment of the present invention.

Next, as shown in FIG. 4A, Pt is deposited on the interlayer insulation film 21 in the thickness of 100 to 300 nm, for example, by sputtering method to form a first conductive film 23, which constitutes a lower electrode of the capacitor. The first conductive film 23 may be made of a material other than Pt. For example, the first conductive film 23 may be made of any of iridium (Ir), ruthenium (Ru), and oxides thereof.

Next, PZT as a ferroelectric material is deposited on the conductive film 23 in the thickness of 100 to 300 nm by radio frequency (RF) sputtering method to form a PZT film 24. Thereafter, the PZT film 24 is subjected to crystallization treatment. The crystallization treatment is performed by rapid thermal annealing (RTA), which is a method of heating in oxygen atmosphere at the temperature of 600° C. for 30 to 120 seconds, for example. Note that the crystallization treatment is not limited to the RTA, and a method of heating in a heating furnace for several tens of minutes is also applicable.

In addition to the above-described sputtering method, the method of forming the ferroelectric film also includes spin coating method, sol-gel method, and MOCVD method. Moreover, in addition to PZT, the ferroelectric material also includes PLZT ((Pb,La)(Zr,Ti)O$_3$), SrBi$_2$(Ta$_x$Nb$_{1-x}$)$_2$O$_9$ (where 0<x<1), Bi$_4$Ti$_2$O$_{12}$, and the like.

Figure 4B:
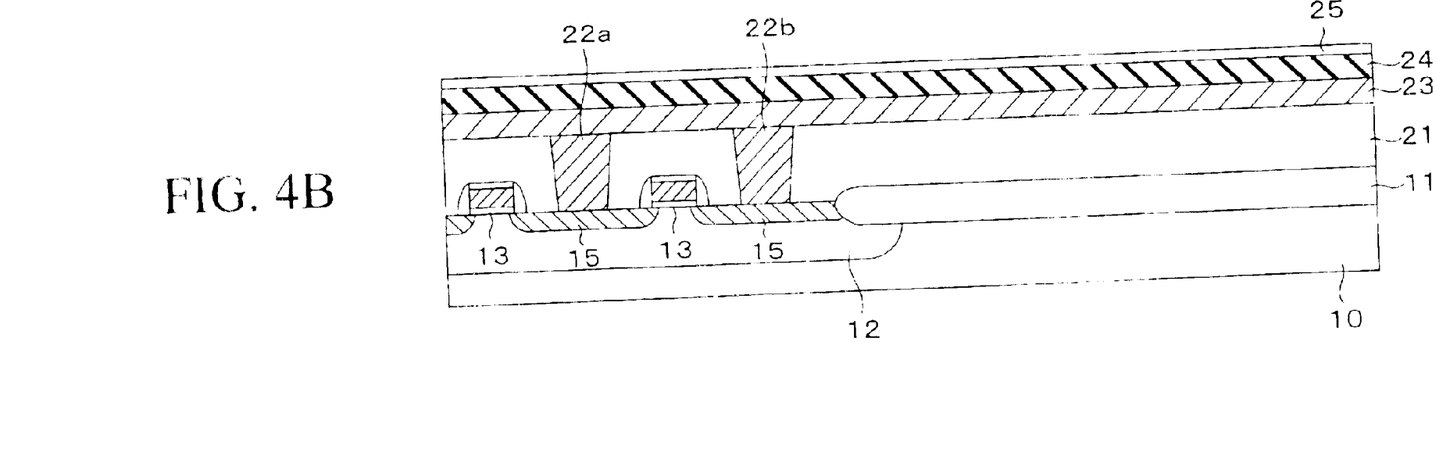

Next, as shown in FIG. 4B, a zirconium silicate (ZrSiO$_4$) solution is coated on the PZT film 24 as a sintering assistance 25 by the spin coating method, and then the sintering assistance 25 is heated up at the level of from 150° C. to 400° C. for drying. Note that the sintering assistance 25 is not limited to Zr-type silicate, and Pb-type silicate and other silicate are also usable herein.

Thereafter, sintering treatment is performed by heating at the temperature of 700° C. for several minutes to several tens of minutes. In this way, sintering of crystals constituting the PZT film 24 is accelerated and unevenness on the surface of the PZT film 24 is reduced, whereby tiny pores in grain boundaries are considerably reduced.

Figure 5A:
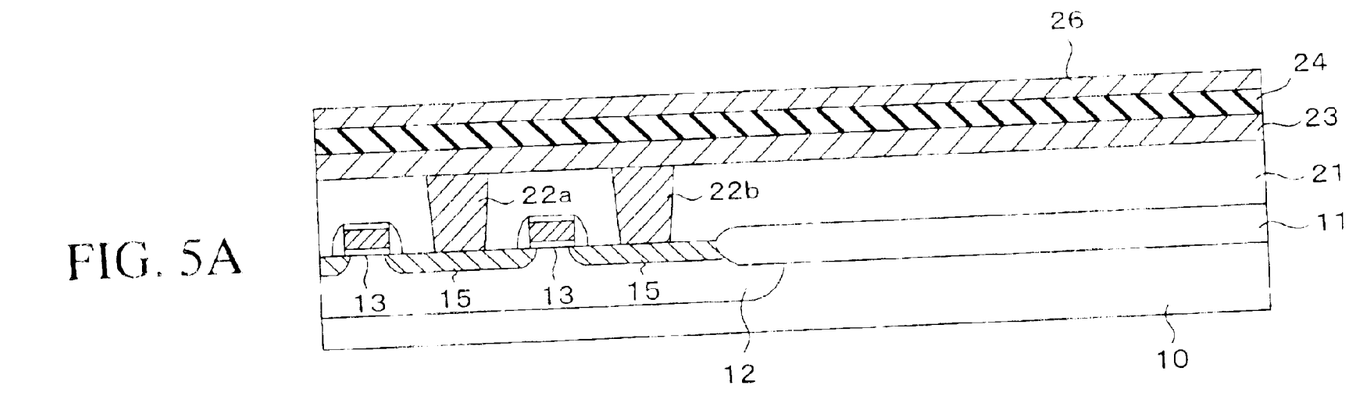
FIGS. 5A and 5B are cross-sectional views showing the method of manufacturing the ferroelectric capacitor according to the first embodiment of the present invention.

Next, as shown in FIG. 5A, Pt is deposited on the PZT film 24 in the thickness of 100 to 300 nm by the sputtering method to form a second conductive film 26 which constitutes an upper electrode. The second conductive film 26 may be made of a material other than Pt. For example, the second conductive film 26 may be made of any of Ir, Ru, and oxides thereof.

Figure 5B:
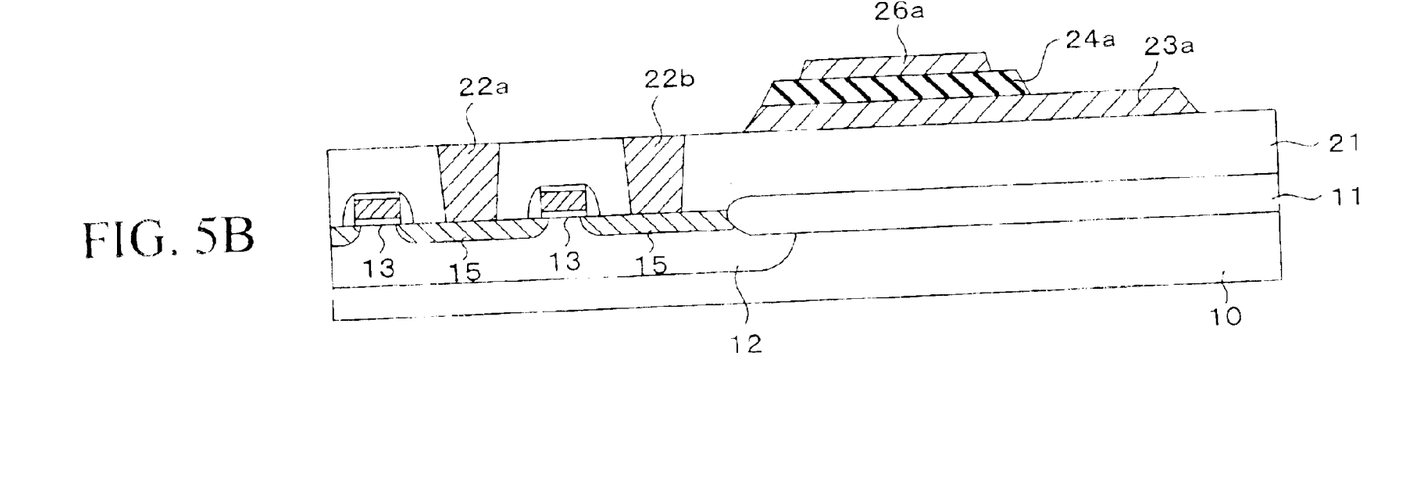

Thereafter, the second conductive film 26, the PZT film 24, and the first conductive film 23 are serially patterned by the photolithography method. In this way, as shown in FIG. 5B, the ferroelectric capacitor composed of an upper electrode 26a, a ferroelectric film 24a and a lower electrode 23a. One ferroelectric capacitor is formed on one memory cell.

After forming the ferroelectric capacitor as described above, as shown in FIG. 6, an interlayer insulation film 27 is formed to cover the ferroelectric capacitor. This interlayer insulation film 27 is made of SiO$_2$, SiN, SiON or the like, for example.

Figure 6:
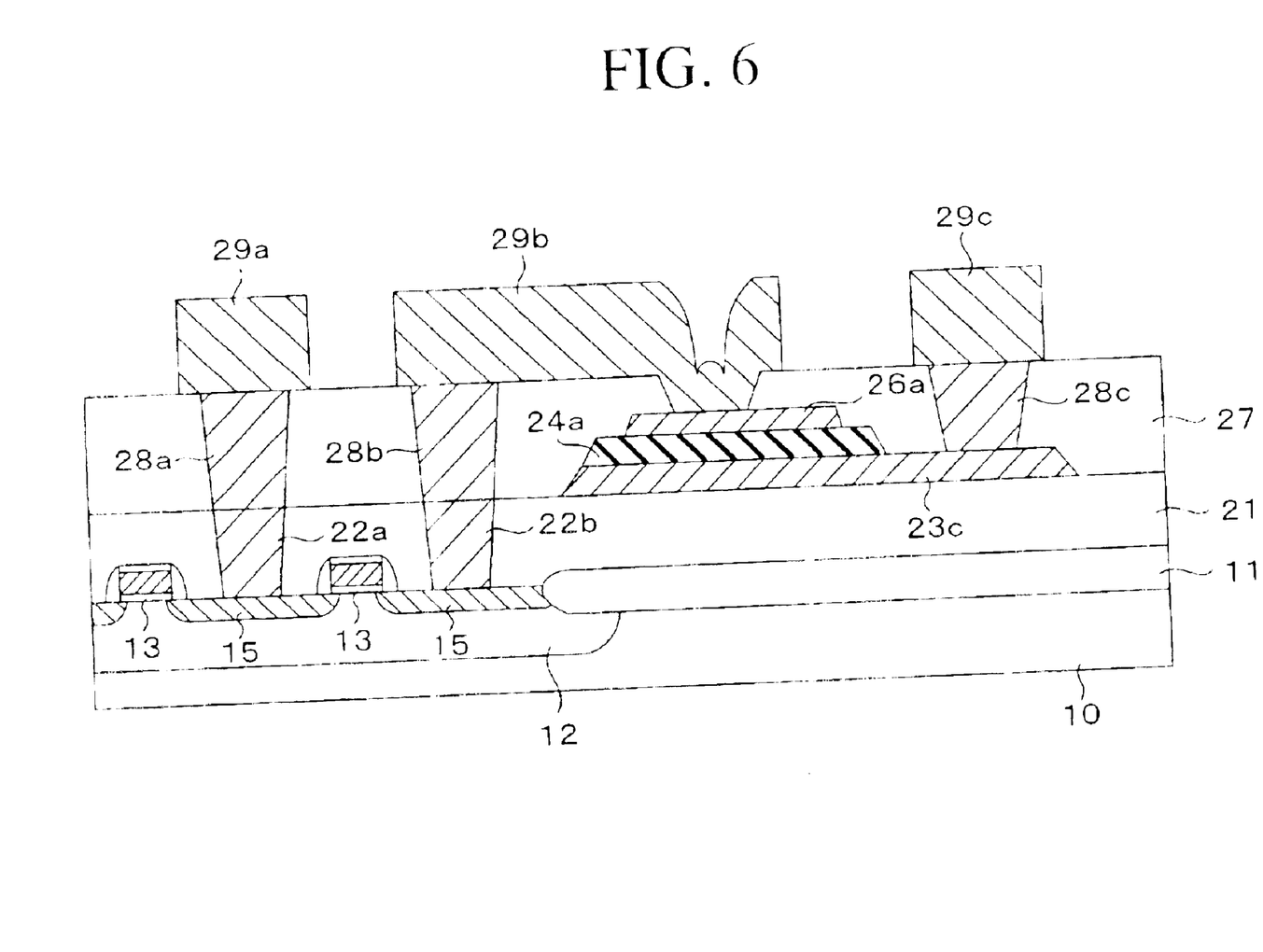
FIG. 6 is a cross-sectional view showing the method of manufacturing the ferroelectric capacitor according to the first embodiment of the present invention.

Next, by the photolithography method, contact holes reaching from the surface of the interlayer insulation film 27 to the plugs 22a and 22b, and a contact hole reaching from the surface of the interlayer insulation film 27 to the lower electrode 23a are formed. Then, tungsten is filled inside these contact holes to form plugs 28a, 28b, and 28c by a similar method to form the plugs 22a and 22b.

Next, by the photolithography method, a contact hole reaching from the surface of the interlayer insulation film 27 to the upper electrode 26a of the ferroelectric capacitor is formed. Then, a metallic film is formed over the entire upper surface of the semiconductor substrate 10. This metallic film is a laminated film formed by serially laminating a Ti film in the thickness of 20 nm, a TiN film in the thickness of 50 nm, an Al film in the thickness of 500 nm, and a TiN film in the thickness of 100 nm, for example. This metallic film is patterned so as to form a bit line 29a, a local wiring 29b, and a wiring 29c. The bit line 29a is electrically connected to the n-type impurity region 15 sandwiched by the two gate electrodes 14 on the p-well 12 via the plugs 28a and 22a. One terminal of the local wiring 29b is electrically connected to the n-type impurity region 15 sandwiched by the gate electrode 14 and the element isolation film 11 via the plugs 28b and 22b. Meanwhile, the other terminal of the local wiring 29b is electrically connected to the upper electrode 26a via the contact hole. The wiring 29c is electrically connected to the lower electrode 23a of the capacitor via the plug 28c. In this way, a FeRAM including the ferroelectric capacitor is formed.

In the following, description will be made regarding results of examination about unevenness on a surface of a ferroelectric film, which is actually formed in accordance with this embodiment.

Figure 7:
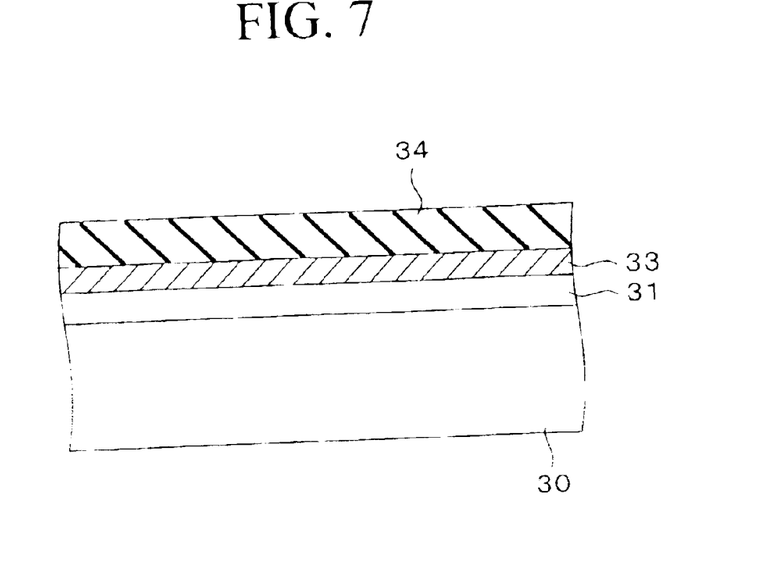
FIG. 7 is a cross-sectional view showing a method of forming a PZT film used for SEM observation.

First, as shown in FIG. 7, Pt is formed in the thickness of 200 nm on an insulation film 31 of a semiconductor substrate 30 as a lower electrode 33. Next, a PZT film 34 is formed in the thickness of 100 nm by the sputtering method, and then crystallization annealing is performed by heating at the temperature of 600° C. for several tens of seconds.

Meanwhile, a ZrSiO$_4$ solution is prepared as the sintering assistance. Then, this ZrSiO$_4$ solution is coated on the PZT film 34 in the thickness of about 2 to 3 nm by the spin coating method. Thereafter, the ZrSiO$_4$ solution is dried by baking at a temperature in a range from 150° C. to 400° C. Subsequently, crystals in the PZT film 34 are sintered by heating at the temperature of 700° C. for several minutes.

Figure 8:
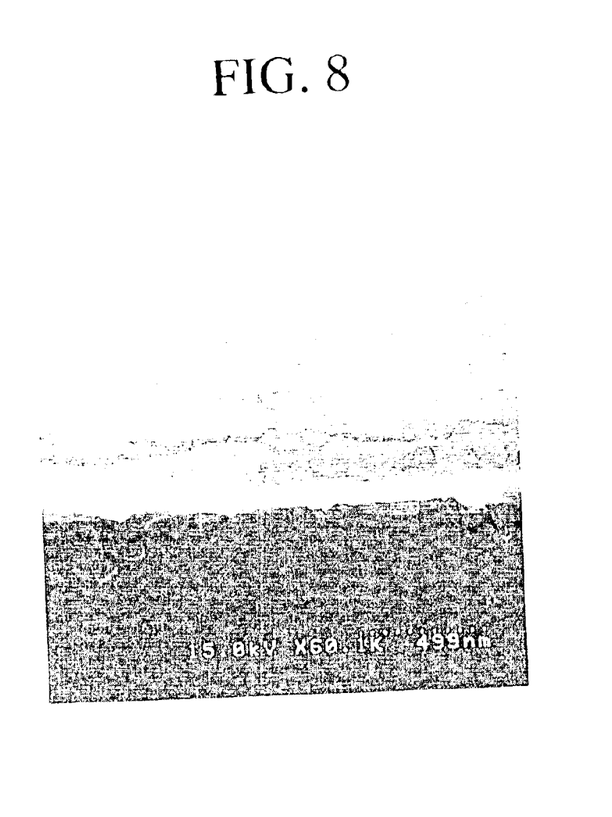
FIG. 8 is a view showing an SEM image of a surface of the PZT film formed by the method of the present invention.

FIG. 8 is a view showing an SEM image of a surface of the PZT film thus formed. As it is apparent from FIG. 8, the surface of the ferroelectric film formed in accordance with this embodiment has lower unevenness and the surface is thereby even. In addition, tiny pores are hardly recognized in grain boundaries. In this way, a leak current of the ferroelectric capacitor is reduced.

As a result of an analysis on the surface of the ferroelectric film after the sintering treatment, it is proved that there is no silicate film thereon. Therefore, according to the present invention, it is apparent that the unevenness on the ferroelectric film is not reduced by silicate films being filled in the unevenness, but by improving crystallinity of the ferroelectric film attributable to the sintering.

Figure 9:
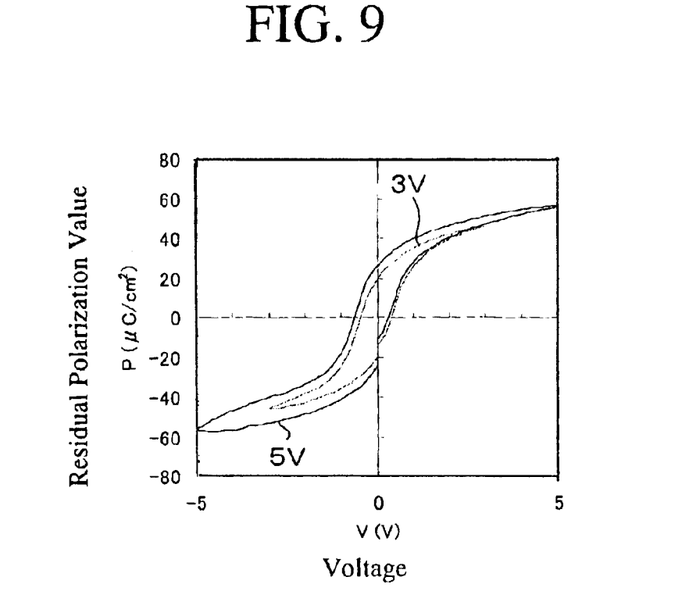
FIG. 9 is a graph showing a result of examination about a hysteresis characteristic of the ferroelectric capacitor formed by the conventional method without using a sintering assistance.
Figure 10:
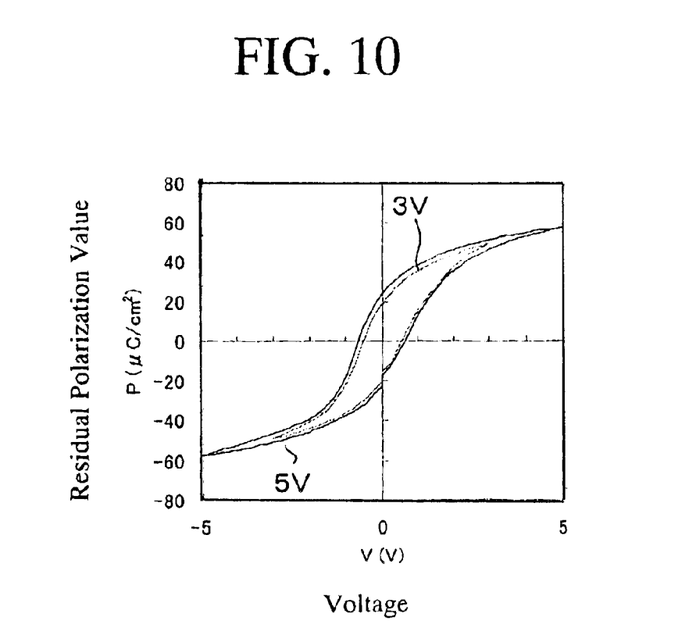
FIG. 10 is a graph showing a result of examination about a hysteresis characteristic of the ferroelectric capacitor manufactured by the method of the present invention.

FIG. 9 is a graph showing a result of examination about a hysteresis characteristic of the ferroelectric capacitor formed by the conventional method without using a sintering assistance. FIG. 10 is a graph showing a result of examination about a hysteresis characteristic of the ferroelectric capacitor formed by the method of this embodiment. Note that applied voltages are 3 V and 5 V in FIGS. 9 and 10.

As it is apparent from FIGS. 9 and 10, the ferroelectric capacitor manufactured by the conventional method does not exhibit sharp hysteresis curves, and residual polarization values between the time driven at 3 V and the time driven at 5 V also show a large difference. On the contrary, the ferroelectric capacitor manufactured by the method of this embodiment exhibits sharp hysteresis curves, and residual polarization values between the time driven at 3 V and the time driven at 5 V show a small difference. Accordingly, it is obvious that the ferroelectric capacitor manufactured in accordance with this embodiment exhibits excellent polarization characteristics. Therefore, the ferroelectric capacitor formed in accordance with this embodiment can achieve equivalent electric characteristics to the conventional capacitor even if the thickness of the ferroelectric film is thinner. Moreover, the ferroelectric capacitor formed in accordance with this embodiment can be operated by lower voltage than that of the ferroelectric capacitor formed by the conventional method.

Figure 11:
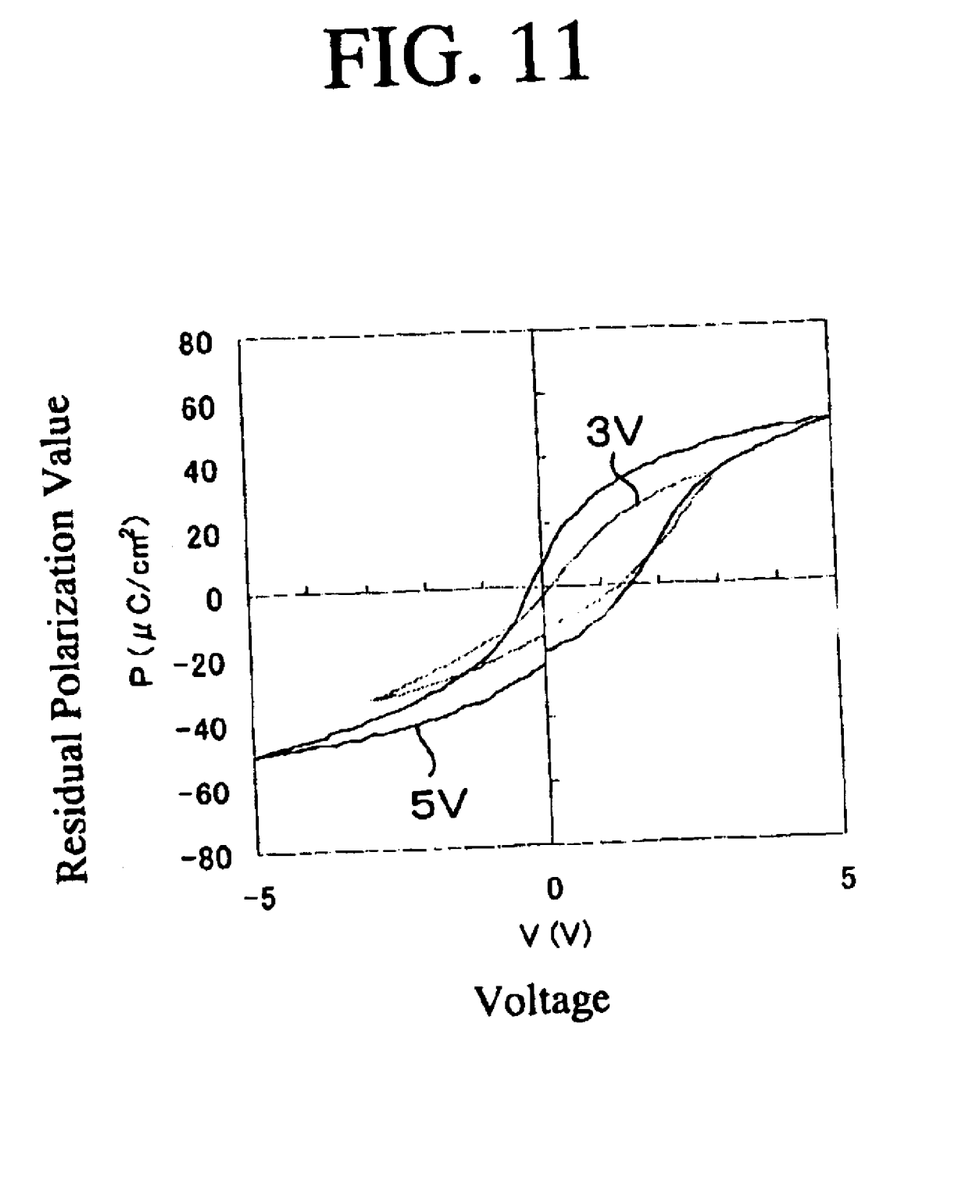
FIG. 11 is a graph showing a result of examination about a hysteresis characteristic of the ferroelectric capacitor manufactured by the method of the present invention after an acceleration test.

FIG. 11 is a graph showing a result of examination about a hysteresis characteristic of the ferroelectric capacitor manufactured by the method of this embodiment after subjecting the ferroelectric capacitor to an acceleration test by hydrogen baking. The hydrogen acceleration test is performed by heating in hydrogen atmosphere at 150° C. for 30 minutes. As shown in FIG. 11, the ferroelectric capacitor manufactured by the method of this embodiment exhibits the hysteresis characteristic even after the hydrogen acceleration test. On the contrary, when the ferroelectric capacitor formed by the conventional method is subjected to a similar hydrogen acceleration test, no hysteresis characteristic is observed due to a leakage.

Accordingly, it is evident that the ferroelectric capacitor formed in accordance with this embodiment shows improvement in quality of the ferroelectric film and can thereby retain excellent characteristics for a long period.

(Second Embodiment)

Figure 12A:
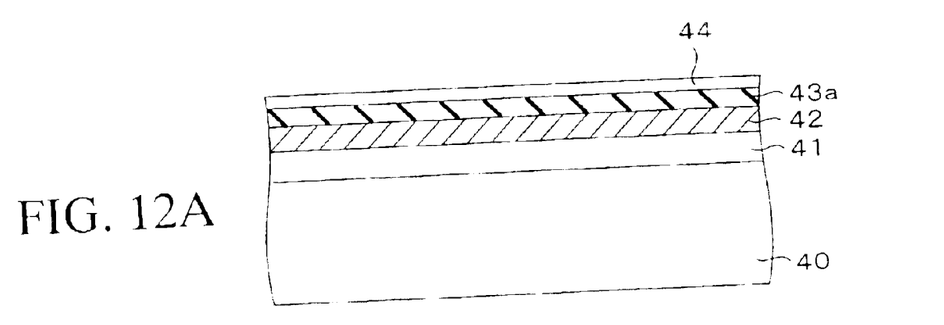
FIGS. 12A to 12C are views showing a method of manufacturing a ferroelectric capacitor according to a second embodiment of the present invention.
Figure 12B:
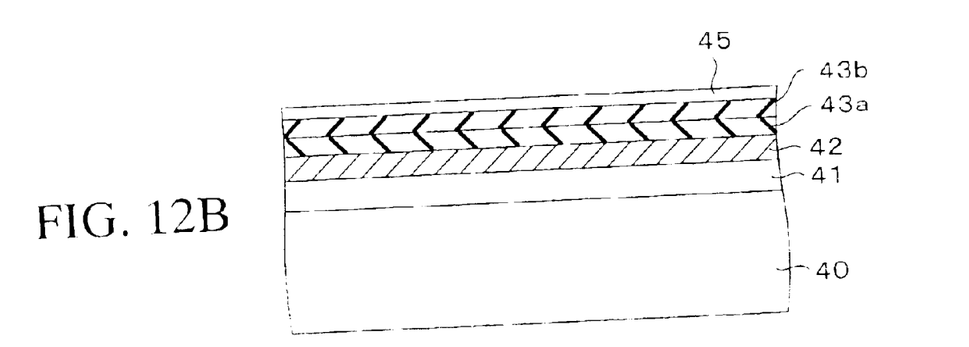
Figure 12C:
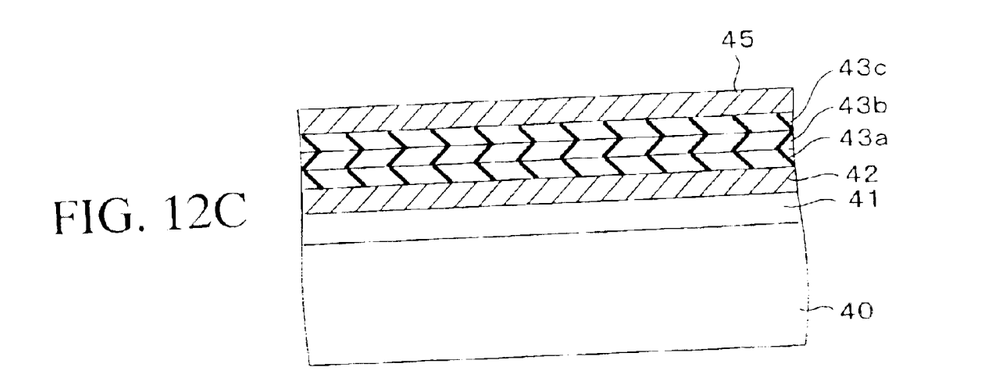

FIGS. 12A to 12C are views showing a method of manufacturing a ferroelectric capacitor according to a second embodiment of the present invention.

First, as shown in FIG. 12A, an insulation film 41 is formed on a semiconductor substrate 40, and a lower electrode 42 is formed thereon. Thereafter, a first PZT layer 43a is formed on the lower electrode 42 by sol-gel method, and subjected to crystallization treatment by heating at the temperature of about 600° C. for several tens of seconds. Subsequently, a solution of a sintering assistance 44 is coated on the first PZT layer 43a, and then dried. Then, crystals of the PZT layer 43a are sintered by heating at the temperature of about 700° C. for several minutes.

Next, as shown in FIG. 12B, a second PZT layer 43b is formed on the first PZT layer 43a by the sol-gel method, and subjected to the crystallization treatment by heating at the temperature of about 600° C. for several tens of seconds. Subsequently, a solution of a sintering assistance 45 is coated on the second PZT layer 43b, and then dried. Then, crystals of the PZT layer 43b are sintered by heating at the temperature of about 700° C. for several minutes.

Next, as shown in FIG. 12C, a third PZT layer 43c is formed on the second PZT layer 43b by the sol-gel method, and subjected to crystallization treatment by heating at the temperature of about 600° C. for several tens of seconds. Subsequently, a solution of a sintering assistance is coated on the third PZT layer 43c and then dried. Then, crystals of the PZT layer 43c are sintered by heating at the temperature of about 700° C. for several minutes.

Subsequently, an upper electrode 46 is formed on the third PZT layer 43c. In this way, a ferroelectric capacitor is completed.

In general, when a ferroelectric film is formed by the sol-gel method, the ferroelectric film of a capacitor is formed by laminating a plurality of ferroelectric layers as described in this embodiment. In this case, it is preferable that the sintering assistance solution is coated every time of formation of each ferroelectric layer, and the ferroelectric layer is subjected to the sintering treatment as described in this embodiment. In this way, it is possible to form the ferroelectric film with lower unevenness on the surface, and to form far fewer pores in grain boundaries. This embodiment can also achieve an effect equivalent to the first embodiment.

Note that description has been made in this embodiment regarding the case of forming the plurality of ferroelectric layers by the sol-gel method. However, the ferroelectric film may be formed by laminating a plurality of ferroelectric layers by sputtering method or other methods instead.

Moreover, description has been made in this embodiment regarding the case of performing the sintering treatment in every time of formation of the sintering assistance films. However, the sintering treatment may take place only once after alternately forming the ferroelectric layers and the sintering assistance films.

(Third Embodiment)

Figure 13A:
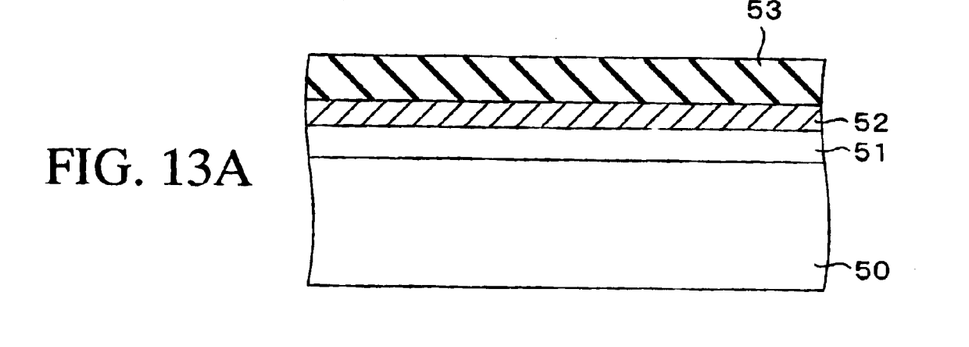
FIGS. 13A to 13C are cross-sectional views showing a method of manufacturing a ferroelectric capacitor in the order of the steps according to a third embodiment of the present invention.
Figure 13B:
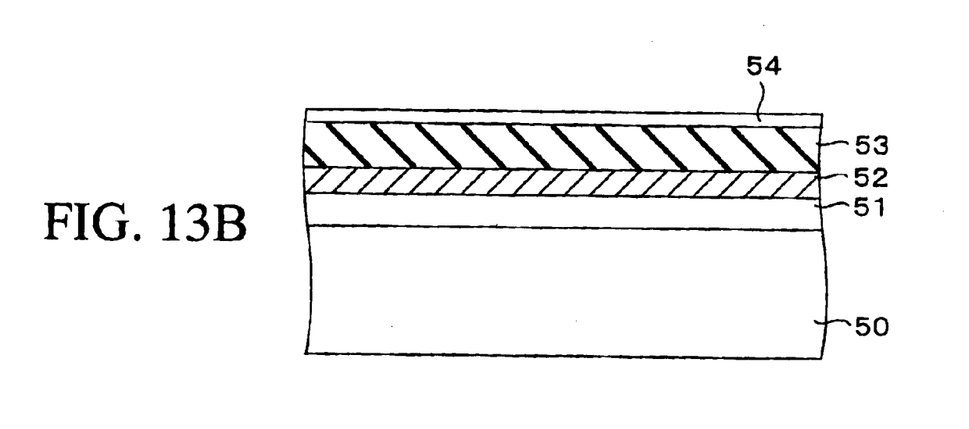
Figure 13C:
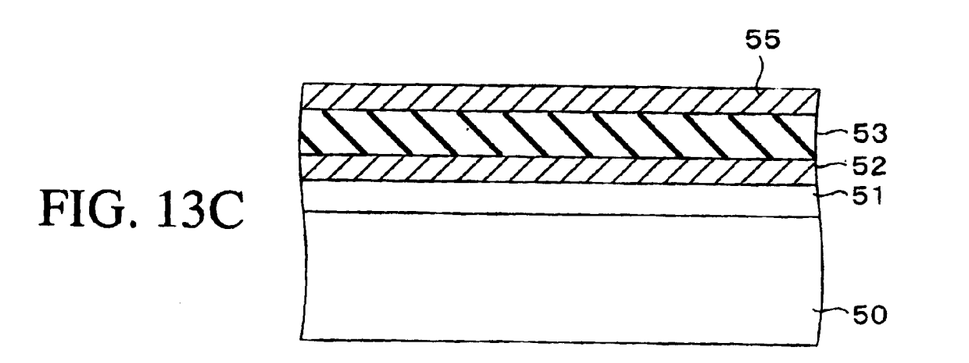

FIGS. 13A to 13C are cross-sectional views showing a method of manufacturing a ferroelectric capacitor in the order of the steps according to a third embodiment of the present invention.

First, as shown in FIG. 13A, an insulation film 51 is formed on a semiconductor substrate 50, and then a lower electrode 52 is formed thereon by use of a conductive material such as Pt. Thereafter, a PZT film 53 is formed on the lower electrode 52 by sputtering method or the like. Then, the PZT film 53 is subjected to crystallization treatment at the temperature of about 600° C. Thereafter, a mixed solution of PZT and silicate is coated on the PZT film 53 to form a film of a sintering assistance 54. Then, after sufficiently drying the film of the sintering assistance 54, the PZT film 53 is subjected to sintering treatment at the temperature of about 700° C. Thereafter, an upper electrode 55 is formed on the PZT film 53 by use of a conductive material such as Pt.

In this embodiment as well, unevenness on the surface of the PZT film 53 is reduced, and pores in grain boundaries are also reduced. Accordingly, this embodiment can also achieve an effect equivalent to the first embodiment.

As described above, according to the method of manufacturing the ferroelectric capacitor of the present invention, the sintering assistance film is formed on the ferroelectric film, then the sintering treatment is performed. Therefore, the unevenness on the ferroelectric film surface is reduced, and pores in grain boundaries are also reduced. In this way, the leak current of the ferroelectric capacitor is reduced, and the electric characteristics are thereby improved. Moreover, the ferroelectric capacitor manufactured by the method of the present invention also has an effect of a capability of retaining excellent characteristics for a long period.

What is claimed is:

1. A method of manufacturing a ferroelectric capacitor comprising the steps of:

forming a lower electrode on a semiconductor substrate via an insulation film;

forming a ferroelectric film on the lower electrode;

subjecting the ferroelectric film to crystallization treatment;

forming a sintering assistance film, that is mixed with a ferroelectric material, on the ferroelectric film;

subjecting the ferroelectric film to sintering treatment; and forming an upper electrode on the ferroelectric film.

2. The method of manufacturing a ferroelectric capacitor according to claim 1, wherein silicate is used as the sintering assistance.

3. The method of manufacturing a ferroelectric capacitor according to claim 1, wherein the ferroelectric film is formed by use of PZT as a material.

4. The method of manufacturing a ferroelectric capacitor according to claim 1, wherein the ferroelectric film is formed by sputtering method.

5. A method of manufacturing a ferroelectric capacitor comprising the steps of:

forming a lower electrode on a semiconductor substrate via an insulation film;

forming a ferroelectric film on the lower electrode; and forming an upper electrode on the ferroelectric film, wherein the ferroelectric film is formed by repeating a plurality of times the steps of forming a ferroelectric film, forming a sintering assistance film, that is mixed with a ferroelectric material, on the ferroelectric film, and performing sintering treatment.

6. The method of manufacturing a ferroelectric capacitor according to claim 5, wherein the ferroelectric film is formed by use of PZT as a material.

7. The method of manufacturing a ferroelectric capacitor according to claim 5, wherein the ferroelectric film is formed by sol-gel method.

8. A method of manufacturing a ferroelectric capacitor comprising the steps of:

forming a lower electrode on a semiconductor substrate via an insulation film;

forming a ferroelectric film on the lower electrode; and forming an upper electrode on the ferroelectric film, wherein the ferroelectric film is formed by repeating a plurality of times the steps of forming a ferroelectric film and forming a sintering assistance film, that is mixed with a ferroelectric material, on the ferroelectric film, and then by performing sintering treatment.

9. The method of manufacturing a ferroelectric capacitor according to claim 8, wherein the ferroelectric film is formed by use of PZT as a material.

10. The method of manufacturing a ferroelectric capacitor according to claim 8, wherein the ferroelectric film is formed by sol-gel method.

* * * * *